United States Patent
Kang et al.

(10) Patent No.: US 7,687,802 B2
(45) Date of Patent: Mar. 30, 2010

(54) ORGANIC THIN FILM TRANSISTOR AND ORGANIC LIGHT EMITTING DISPLAY DEVICE INCLUDING THE SAME

(75) Inventors: Tae-Min Kang, Suwon-si (KR); Taek Ahn, Suwon-si (KR); Min-Chul Suh, Suwon-si (KR)

(73) Assignee: Samsung Mobile Display Co., Ltd., Nongsoo-Dong, Giheung-Gu, Yongin, Gyunggi-Do (KR)

( * ) Notice: Subject to any disclaimer, the term of this patent is extended or adjusted under 35 U.S.C. 154(b) by 541 days.

(21) Appl. No.: 11/646,493

(22) Filed: Dec. 28, 2006

(65) Prior Publication Data

US 2007/0152223 A1 Jul. 5, 2007

(30) Foreign Application Priority Data

Jan. 2, 2006 (KR) ...................... 10-2006-0000156

(51) Int. Cl.
  *H01L 51/10* (2006.01)
(52) U.S. Cl. .................................. 257/40; 257/E51.006
(58) Field of Classification Search ................... 257/40, 257/E51.006
  See application file for complete search history.

(56) References Cited

U.S. PATENT DOCUMENTS 6,836,067 B1 12/2004 Imai
7,317,432 B2 * 1/2008 Koyama ...................... 345/76

2005/0151195 A1 7/2005 Kawase et al.

FOREIGN PATENT DOCUMENTS

| JP | 2004-241528 | * 8/2004 |
|---|---|---|
| KR | 10-2005-0010494 | 1/2005 |
| KR | 10-2005-0119889 | 12/2005 |

OTHER PUBLICATIONS

Machine Translation of JP 2004-241528.*
Korean Office action corresponding to Korean Patent Application No. 2006-0000156, issued on Mar. 30, 2007.
Office Action from the State Intellectual Property Office issued in Applicant's corresponding Chinese Patent Application No. 200710001861.1 dated May 22, 2009. (With English translation).

* cited by examiner

*Primary Examiner*—Evan Pert
(74) *Attorney, Agent, or Firm*—Robert E. Bushnell, Esq.

(57) ABSTRACT

An organic thin film transistor (OTFT) having a patterned organic semiconductor layer on top of an electrode wiring layer. In order to avoid damage to the underlying electrode wiring layer, the organic semiconductor layer is patterned so that none of the organic semiconductor layer is removed off the electrode wiring layer. The patterned organic semiconductor layer completely covers all of the underlying electrode wiring layer. The OTFT includes a gate electrode, source and drain electrodes insulated from the gate electrode and an organic semiconductor layer which is insulated from the gate electrode and is in contact with the source and drain electrodes, wherein the organic semiconductor layer completely covers the source and drain electrodes. In addition, an organic light emitting display device includes more than one OTFT as well as an organic light-emitting element electrically connected to the electrical conductor.

9 Claims, 5 Drawing Sheets

ORGANIC THIN FILM TRANSISTOR AND ORGANIC LIGHT EMITTING DISPLAY DEVICE INCLUDING THE SAME

CLAIM OF PRIORITY

This application makes reference to, incorporates the same herein, and claims all benefits accruing under 35 U.S.C. §119 from an application earlier filed in the Korean Intellectual Property Office on Jan. 2, 2006 and there duly assigned Ser. No. 10-2006-0000156.

BACKGROUND OF THE INVENTION

1. Field of the Invention

The present invention relates to an organic thin film transistor (OTFT) having a patterned organic semiconductor layer designed to prevent damage to an underlying electrode wiring layer formed, and an organic light emitting display device including the OTFT.

2. Description of the Related Art

Active matrix (AM) organic light emitting display devices include a pixel circuit for each pixel. A pixel circuit is electrically connected to a scan line, a data line, and a power supply line and includes a thin film transistor (TFT) and a storage capacitor. Organic thin film transistors (OTFTs) use an organic layer as a semiconductor layer instead of using a silicon layer. OTFTs can operate at a low temperature and can be used as driving devices, and thus have been actively researched as possible switching elements of flexible organic light emitting display devices.

An organic light emitting display device that uses OTFTs as switching devices includes an organic semiconductor layer and a plurality of electrode wiring layers. When patterning the organic semiconductor layer, sometimes the underlying electrode wiring layers can be damaged. In particular, when patterning, sometimes source and drain electrodes of OTFTs can be damaged.

OTFTs include an organic semiconductor layer formed on the source and drain electrodes. In OTFTs, the organic semiconductor layer covers a portion of the source and drain electrodes because the organic semiconductor layer is patterned to form only a channel and not to completely cover the source and drain electrodes. Accordingly, when patterning an organic semiconductor layer of an OTFT, the organic semiconductor layer is blanket formed, and then parts of the organic semiconductor layer that will not become part of the channel are removed using a laser, etc. Since the source and drain electrodes and other electrode wiring layers can be damaged during this removal of the organic semiconductor layer, the OTFT can be defective. Therefore, what is needed is a design for a design for an OTFT and a design for a display using the same that does not result in a damaged electrode layer.

SUMMARY OF THE INVENTION

It is therefore an object of the present invention to provide a design for an OTFT and a design for a display using the same that does not result in damaged electrode wiring layers.

It is also an object of the present invention to provide a design for an OTFT and a design for a display using the same that allows for a patterning of an organic semiconductor layer without damaging an underlying electrode wiring layer.

It is further an object of the present invention to provide an organic thin film transistor (OTFT) having a patterned organic semiconductor layer for protecting an electrode wiring layer formed before the organic semiconductor layer is patterned, and an organic light emitting display device including the OTFT.

According to an aspect of the present invention, there is provided an organic thin film transistor including a gate electrode, a source electrode and a drain electrode insulated from the gate electrode and an organic semiconductor layer insulated from the gate electrode and in contact with the source and drain electrodes, wherein the organic semiconductor layer covers each of the source and drain electrodes.

The source and drain electrodes can be insulated from the gate electrode by a gate insulating layer. The organic semiconductor layer can completely cover each of the source electrode and the drain electrode. The organic thin film transistor can also include a wiring layer connected to the source and drain electrodes. This wiring layer can also be completely covered by the organic semiconductor layer. The organic semiconductor layer can include a material selected from the group consisting of pentacene, tetracene, anthracene, naphthalene, $\alpha$-6-thiophen, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylene vinylene and a derivative thereof, polyfluorene and a derivative thereof, polythiophene vynylene and a derivative thereof, polyparaphenylene and a derivative thereof, a polythiophene-heterocyclic aromatic copolymer and a derivative thereof, oligoacence of naphthalene and a derivative thereof, oligothiophene of $\alpha$-5-thiophene and a derivative thereof, a metal-containing or metal-free phthalocyanine and a derivative thereof, pyromellitic dianhydride and a derivative thereof, pyromellitic diimide and a derivative thereof, perylene tetracarboxylic acid dianhydride and a derivative thereof, naphthalene tetracarboxylic acid diimide and a derivative thereof, naphthalene tetracarboxylic acid dianhydride and a derivative thereof.

According to another aspect of the present invention, there is provided an organic light emitting display device that includes a substrate, an electrical conductor arranged on the substrate, an organic semiconductor layer covering the electrical conductor and an organic light-emitting element electrically connected to the electrical conductor.

The organic light emitting display device can also include a pixel circuit electrically connected to the organic light-emitting element, wherein the electrical conductor is at least one electrode wiring of the pixel circuit. The pixel circuit can include an organic thin film transistor (TFT), a capacitor, a data wiring layer, a scan wiring layer and a driving wiring layer. The organic thin film transistor can include a gate electrode, and source and drain electrodes insulated from the gate electrode. The organic semiconductor layer can completely cover the electrical conductor.

The organic semiconductor layer can include one selected from the group consisting of pentacene, tetracene, anthracene, naphthalene, $\alpha$-6-thiophen, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylene vinylene and a derivative thereof, polyfluorene and a derivative thereof, polythiophene vynylene and a derivative thereof, polyparaphenylene and a derivative thereof, a polythiophene-heterocyclic aromatic copolymer and a derivative thereof, oligoacence of naphthalene and a derivative thereof, oligothiophene of $\alpha$-5-thiophene and a derivative thereof, a metal-containing or metal-free phthalocyanine and a derivative thereof, pyromellitic dianhydride and a derivative thereof, pyromellitic diimide and a derivative thereof, perylene tetracarboxylic acid dianhydride and a derivative thereof, naphthalene tetracarboxylic acid diimide and a derivative thereof, naphthalene tetracarboxylic acid dianhydride and a derivative thereof.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate same or similar components, wherein.

DETAILED DESCRIPTION OF THE INVENTION

Figure 1:
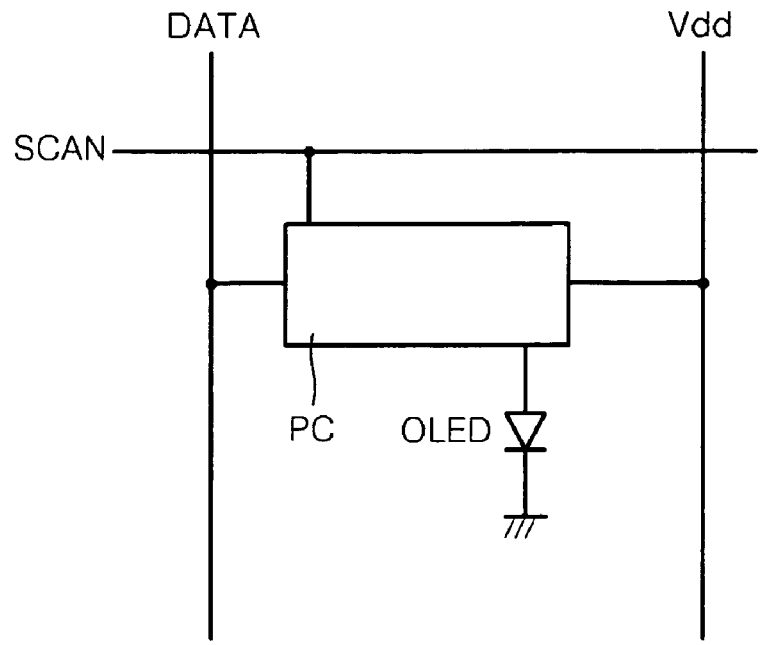
FIG. 1 is a view of a circuit diagram of a pixel circuit (PC) used in an organic light emitting display device according to an embodiment of the present invention.

Turning now to the figures, FIG. 1 is a view of a circuit diagram of a pixel circuit (PC) used in an organic light emitting display device according to embodiment of the present invention. As illustrated in FIG. 1, each of a plurality of pixels in the organic light emitting display device includes a data line DATA, a scan line SCAN and an organic light-emitting element and a power supply line Vdd that supplies power to the OLED. The PC of each pixel is electrically connected to the data line DATA, the scan line SCAN and the power supply line Vdd and controls the light emission of the OLED.

Figure 2:
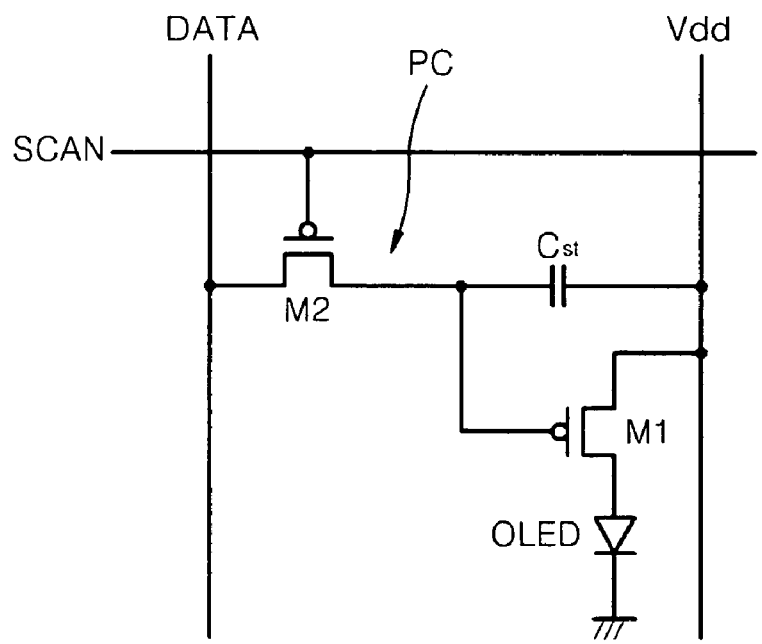
FIG. 2 is a detailed view of a circuit diagram of the PC of FIG. 1.

Turning now to FIG. 2, FIG. 2 is a detailed view of a detailed circuit diagram of the PC of FIG. 1 according to an embodiment of the present invention. The PC includes a driving TFT M1, a switching TFT M2, and a single storage capacitor Cst. Referring to FIG. 2, each pixel of the organic light-emitting display device according to the present embodiment of the present invention includes at least two thin film transistors, namely, the switching TFT M2 and the driving TFT M1, the storage capacitor Cst, and the OLED.

The switching TFT M2 is turned on/off by a scan signal received by the scan line SCAN and delivers a data signal from the data line DATA to the storage capacitor Cst and the driving TFT M1. The present invention is not limited to the case in which the switching TFT M2 is a single TFT as illustrated in FIG. 2. Alternatively, a switching device can include a plurality of TFTs and a capacitor. The pixel of FIG. 2 can further include a circuit which compensates for the Vth value of the driving TFT M1 or a circuit which compensates for the voltage drop in the power supply line Vdd.

The driving TFT M1 determines the amount of current flowing into the OLED according to the data signal received through the switching TFT M2. The storage capacitor Cst stores the data signal received through the switching TFT M2 for one frame.

Although the driving TFT M1 and the switching TFT M2 are illustrated as PMOS TFTs in FIG. 2, the present invention is not limited thereto. At least one of the driving TFT M1 and the switching TFT M2 can be implemented as an NMOS TFT. In addition, the number of TFTs and the number of capacitors are not limited to those illustrated in FIG. 2. In other words, a greater number of TFTs and a greater number of capacitors than those illustrated in FIG. 2 can be included.

Figure 3:
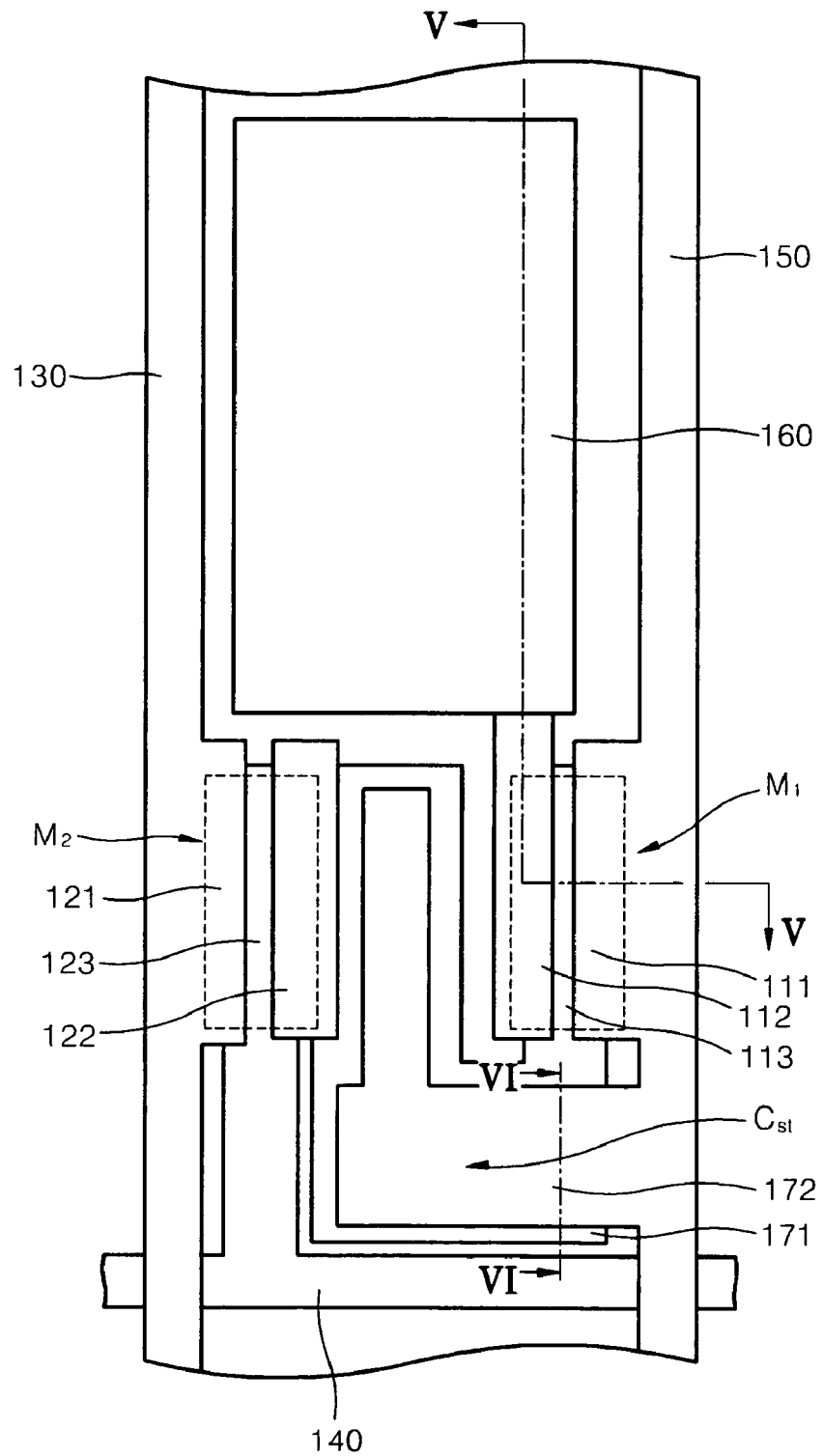
FIG. 3 is a view of electrode wiring layers of a bottom gate type organic light emitting display device according to an embodiment of the present invention.
Figure 4:
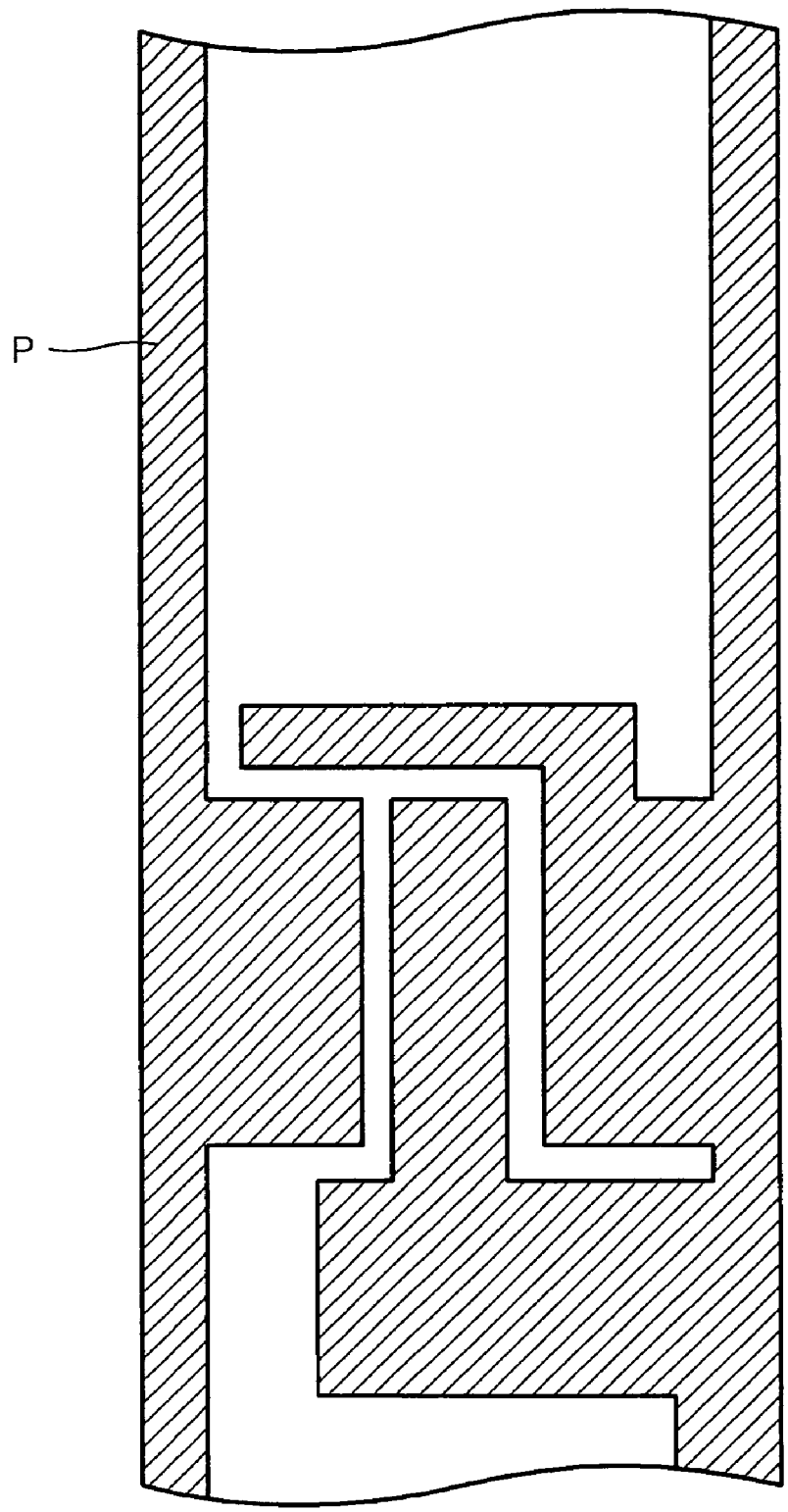
FIG. 4 is a view of a patterned organic semiconductor layer formed on the electrode wiring layers of the bottom gate type organic light emitting display device of FIG. 3.
Figure 5:
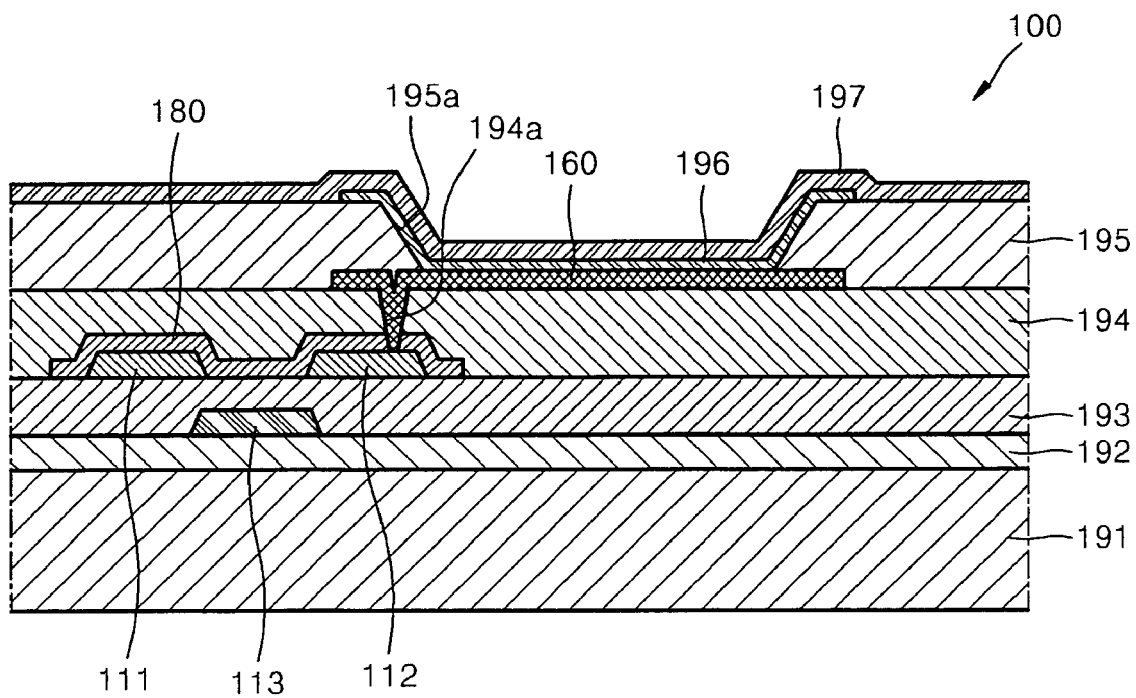
FIG. 5 is a cross-sectional view of the bottom gate type organic light emitting display device taken along line V-V of FIG. 3.
Figure 6:
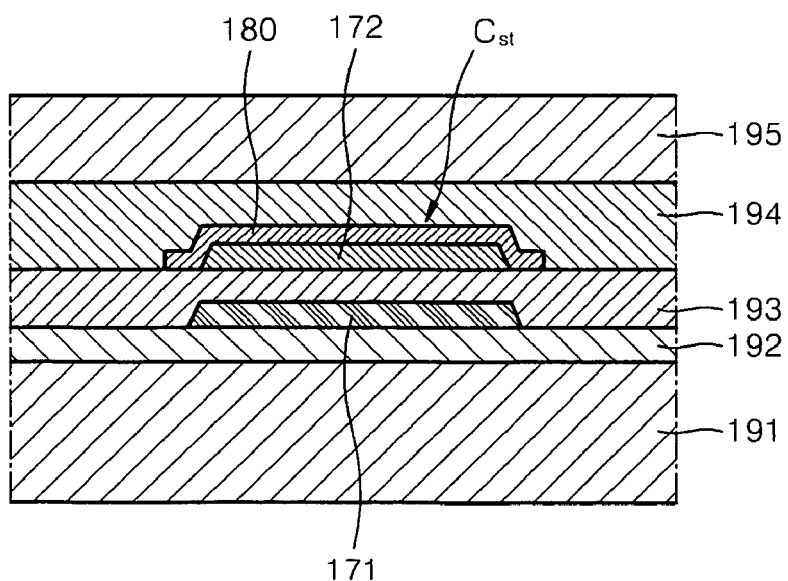
FIG. 6 is a cross-sectional view of the bottom gate type organic light emitting display device taken along line VI-VI of FIG. 3.

Turning now to FIGS. 3 through 6, FIG. 3 is a view of electrode wiring layers of a bottom gate type organic light emitting display device 100 according to an embodiment of the present invention, FIG. 4 is a view of a patterned organic semiconductor layer formed on the electrode wiring layers of the bottom gate type organic light emitting display device 100 of FIG. 3, FIG. 5 is a cross-sectional view of the bottom gate type organic light emitting display device 100 taken along a line V-V of FIG. 3, and FIG. 6 is a cross-sectional view of the bottom gate type organic light emitting display device 100 taken along a line VI-VI of FIG. 3

Referring now to FIG. 3, driving TFT M1 includes a first source electrode 111, a first drain electrode 112 and a first gate electrode 113. Switching TFT M2 includes a second source electrode 121, a second drain electrode 122 and a second gate electrode 123. A data wiring layer 130 constituting a data line DATA is electrically connected to the second source electrode 121. A scan wiring layer 140 constituting the scan line SCAN is electrically connected to the second gate electrode 123. A driving wiring layer 150 constituting the power supply line Vdd is electrically connected to the first source electrode 111. A pixel electrode 160 is electrically connected to the first drain electrode 112. In addition, a first capacitor layer 171 included in a storage capacitor Cst is connected to the second drain electrode 122 through a contact hole (not shown). A second capacitor layer 172 is arranged so as to be electrically connected to the driving wiring layer 150.

Here, the first source electrode 111, the first drain electrode 112, the second source electrode 121, the second drain electrode 122, the data wiring layer 130, the driving electrode 150, and the second capacitor layer 172 are formed on a gate insulating layer 193. The first gate electrode 113, the second gate electrode 123, the scan wiring layer 140, and the first capacitor layer 171 are formed on a buffer layer 192. The first source electrode 111, the first drain electrode 112, the second source electrode 121, the second drain electrode 122, the data wiring layer 130, the driving electrode 150, the second capacitor layer 172, the first gate electrode 113, the second gate electrode 123, the scan wiring layer 140, and the first capacitor layer 171 are all electrical conductors.

After each of the electrodes are formed, an organic semiconductor layer is formed on a gate insulating layer 193. After forming the organic semiconductor layer, the organic semiconductor layer is patterned using a laser ablation (LAT) method.

When the organic semiconductor layer is patterned, parts of the organic semiconductor layer remaining after patterning are denoted by the shaded area (P) of FIG. 4. By doing so, no metal is exposed so that there is no removal of any of the organic semiconductor layer that covers the electrode wiring layer. Specifically, each of the first source electrode 111, the first drain electrode 112, the second source electrode 121, the second drain electrode 122, the data wiring layer 130, the driving wiring layer 150, and the second capacitor layer 172 formed on the gate insulating layer 193 are still totally covered with the organic semiconductor layer, even after the patterning of the organic semiconductor layer.

It is to be appreciated that the LAT process in the patterning of the organic semiconductor layer can damage an underlying electrode wiring layer, especially when the organic semiconductor layer is removed off an underlying electrode wiring layer. Therefore, the present invention avoids this damage to the electrode wiring layer by only removing portions of the organic semiconductor layer that do not lie on top of the electrode wiring layer.

Turning now to FIGS. 5 and 6, FIGS. 5 and 6 each illustrate cross-sectional views of the bottom gate type organic light emitting display device 100 including an organic semiconductor layer 180 after the patterning as described above, according to an embodiment of the present invention. Referring to FIG. 5, the buffer layer 192 is formed on a substrate 191. The first gate electrode 113 is formed on the buffer layer 192. After forming the first gate electrode 113, the gate insulating layer 193 is formed so as to cover the first gate electrode 113.

Here, the substrate 191 can be a glass substrate, a plastic substrate or a metal substrate. The metal substrate can be formed of metal foil, for example, stainless steel, Ti, Mo, an Invar alloy, an Inconel alloy, a Kovar alloy, or the like. The plastic substrate can include a plastic film made out of either polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulous triacetate (TAC) or cellulose acetate propinonate (CAP).

The buffer layer 192 is formed of an organic compound and/or an inorganic compound, preferably, $SiO_x$ ($x \geq 1$) or $SiN_x$ ($x \geq 1$). The gate insulating layer 193 can be an organic insulating layer, an inorganic insulating layer or an organic-inorganic hybrid layer, and can be formed as a single-layered or multi-layered structure.

Meanwhile, after forming the gate insulating layer 193, the first source electrode 111 and the first drain electrode 112 are formed on the gate insulating layer 193. The organic semiconductor layer 180 is formed using the patterning as described above. Here, the organic semiconductor layer 180 covers the first source electrode 111 and the first drain electrode 112 completely.

The first source electrode 111, the first drain electrode 112 and the first gate electrode 113 are formed of materials having good electrical conductivity, such as a metal such as Ag, Mg, Al, Pt, Pd, Au, Ni, Nd, Ir, Cr, Li, Ca, a compound thereof, or the like.

The organic semiconductor layer 180 can be formed of at least one of pentacene, tetracene, anthracene, naphthalene, α-6-thiophen, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylene vinylene and a derivative thereof, polyfluorene and a derivative thereof, polythiophene vynylene and a derivative thereof, polyparaphenylene and a derivative thereof, a polythiophene-heterocyclic aromatic copolymer and a derivative thereof, olignaphthalene and a derivative thereof, oligothiophene of α-5-thiophene and a derivative thereof, a metal-containing or metal-free phthalocyanine and a derivative thereof, pyromellitic dianhydride and a derivative thereof, pyromellitic diimide and a derivative thereof, perylene tetracarboxylic acid dianhydride and a derivative thereof, naphthalene tetracarboxylic acid diimide and a derivative thereof, naphthalene perylene tetracarboxylic acid dianhydride and a derivative thereof.

Referring now to FIG. 6, the second capacitor layer 172 is formed on the gate insulating layer 193, wherein the organic semiconductor layer 180 is formed using the patterning as described above to cover the second capacitor layer 172 completely. A planarized insulating layer 194 is further formed to cover the organic semiconductor layer 180. The pixel electrode 160 is formed on the planarized insulating layer 194 while electrically connecting to the first drain electrode 112 through a contact hole 194a. The contact hole 194a can be formed using a laser etching method, a photolithographic method, or the like.

After forming the pixel electrode 160, a pixel definition layer 195 is formed so as to cover the pixel electrode 160. A predetermined opening 195a is formed in the pixel definition layer 195. The pixel definition layer 195 can be an organic insulating layer, an inorganic insulating layer or an organic-inorganic hybrid layer, and can be formed as a single-layered or a multi-layered structure.

The organic insulating layer can be formed of polymer materials, for example, a general purpose compound (PMMA, PS), a polymer derivative including a phenol group, a acryl-based polymer, an imide-based polymer, an aryl ether-based, an amide-based polymer, a fluorine-based polymer, a p-xilylene-based polymer, a vinyl alcohol-based polymer, a blend thereof, or the like. The inorganic insulating layer can be $SiO_2$, $SiN_x$, $SiON$, $Al_2O_3$, $TiO_2$, $Ta_2O_5$, $HfO_2$, $ZrO_2$, BST, PZT, or the like.

The pixel definition layer 195 can be formed using an ink jet printing method. First, some parts of the pixel electrode 160 are surface-treated. In cases where the adhesive force between an untreated substrate surface and the ink is good, a fluorine-based plasma is used to make portions of the substrate surface that corresponds to opening 195a water-repellant. Here, fluorine-based gases such as $CF_4$ or $C_3F_8$ are used in the surface treatment with the fluorine-based plasma. The pixel definition layer 195 is then formed by discharging a solution including insulating materials for the pixel definition layer 195 from an inkjet head. The opening 195a exposing the pixel electrode 160 through the pixel definition layer 195 is formed on the surface-treated parts of the pixel electrode 160.

In cases where the adhesive force between the untreated substrate surface and an ink is poor, that is, the substrate surface is water-repellant, the pixel definition layer 195 can be formed by surface-treating portions of the substrate surface that do not correspond to opening 195a with Ar and $O_2$ plasmas. That is, by surface-treating the parts of the substrate surface except for the pixel electrode 160 corresponding to the opening 195a using Ar and $O_2$ plasmas, the substrate surface is hydrophilized to increase the adhesive force. Next, when ink including insulating materials for forming the pixel definition layer 195 is discharged on the substrate surface, the pixel definition layer 195 is coated on only the surface-treated parts having the increased adhesive force. Accordingly, the pixel definition layer 195 is not formed on a surface of the pixel electrode 160 which is not surface-treated with plasma. Meanwhile, an organic light emitting layer 196 and an opposite electrode 197 are stacked on the exposed pixel electrode 160 sequentially. Here, the opposite electrode 197 is formed to cover all the pixels, but the structure of the opposite electrode 197 is not limited thereto. That is, the opposite electrode 197 can be patterned.

When the pixel electrode 160 is an anode electrode, the opposite electrode 197 is a cathode electrode, or vice versa. In the current embodiment of the present invention, the pixel electrode 160 is an anode electrode.

When the organic light emitting display device 100 is a bottom emission type organic light emitting display device, the pixel electrode 160 can be a transparent electrode, and the opposite electrode 197 can be a reflective electrode. Here, the transparent electrode has a high work function, and can be formed of transparent ITO, IZO, $In_2O_3$, ZnO, or the like. The reflective electrode constituting the opposite electrode 197 is formed of a metal such as Ag, Mg, Al, Pt, Pd, Au, Ni, Nd, Ir, Cr, Li, Ca or a compound thereof having a low work function.

When the organic light emitting display device 100 is a top emission type organic light emitting display device, the pixel electrode 160 can be the reflective electrode, and the opposite electrode 197 can be the transparent electrode. Here, the reflective electrode constituting the pixel electrode 160 can be formed by forming a reflective layer with Ag, Mg, Al, Pt, Pd, Au, Ni, Nd, Ir, Cr, Li, Ca, a compound thereof, or the like, and forming ITO, IZO, ZnO, $In_2O_3$ or the like having a high work function on the reflective layer. The transparent electrode constituting the opposite electrode 197 is formed by depositing Ag, Mg, Al, Pt, Pd, Au, Ni, Nd, Ir, Cr, Li, Ca, a compound thereof, or the like having a low work function, and forming thereon a subsidiary electrode layer or a bus line with transparent materials such as ITO, IZO, ZnO, $In_2O_3$, and the like.

When the organic light emitting display device 100 is a dual emission type organic light emitting display device, both the pixel electrode 160 and the opposite electrode 197 can be transparent electrodes.

Materials for forming the pixel electrode 160 and opposite electrode 197 are not limited to the materials described above, that is, the pixel electrode 160 and opposite electrode 197 can be formed of electrically conductive materials, conductive pastes including conductive particles such as Ag, Mg, Cu, etc., or the like. When the pixel electrode 160 and the opposite electrode 197 are formed of conductive pastes, the conductive pastes can be printed using an ink jet printing method. After printing, the conductive pastes are sintered to form the pixel electrode 160 and the opposite electrode 197.

The organic light emitting layer 196 can be a small molecular weight organic layer or a polymer organic layer. When the organic light emitting layer 196 is a small molecular weight organic layer, a Hole Injection Layer (HIL), a Hole Transport Layer (HTL), an Emission Layer (EML), an Electron Transport Layer (ETL), an Electron Injection Layer (EIL), or the like are stacked to have a single or multi-layer structure. The organic light emitting layer 196 can be formed of organic materials such as copper phthalocyanine (CuPc), N,N'-di (naphthalene-1-yl)-N,N'-diphenyl-benzidine (NPB), tris-8-hydroxyquinoline aluminum ($Alq_3$), or the like, but materials for forming the organic light emitting layer 196 are not limited thereto. The small molecular weight organic layer can be formed using a vapor deposition method.

The polymer organic layer can generally include a HTL and an EML. Here, the HTL can be formed of PEDOT. The EML can be formed of polymer organic materials such as Poly-Phenylenevinylene (PPV)-based materials, Polyfluorene-based materials, or the like using a screen printing method, an ink jet printing method, or the like.

After the bottom gate type organic light emitting display device 100 is formed, an upper part thereof is sealed to provide protection from the atmospheric.

According to the current embodiment of the present invention, by patterning the organic semiconductor layer 180 so as to completely cover the electrode wiring layers formed on the gate insulating layer 193, that is the first source electrode 111, the first drain electrode 112, the second source electrode 121, the second drain electrode 122, the data wiring layer 130, the driving wiring layer 150, and the second capacitor layer 172, the electrode wiring layers are not damaged during the patterning of the organic semiconductor layer 180.

Figure 7:
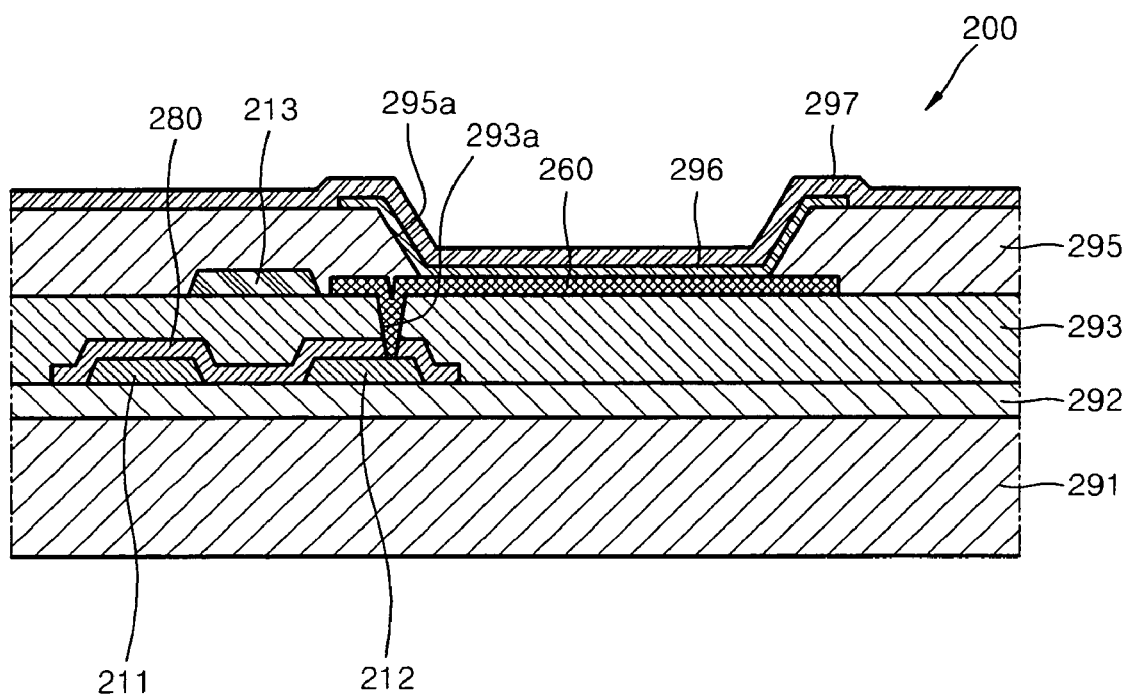
FIG. 7 is a schematic cross-sectional view of a top gate type organic light emitting display device according to another embodiment of the present invention.

Turning now to FIG. 7, FIG. 7 is a schematic cross-sectional view of an organic light emitting display device 200 according to another embodiment of the present invention. The organic light emitting display device 200 is a top gate type organic light emitting display device. The structure of the top gate type organic light emitting display device 200 is described as follows with reference to FIG. 7.

First, a buffer layer 292 is formed on a substrate 291. A first source electrode 211 and a first drain electrode 212 are formed on the buffer layer 292. Although not illustrated in FIG. 7, a second source electrode, a second drain electrode, a data wiring layer, a driving wiring layer, and a second capacitor layer can also be formed on the buffer layer 292.

After forming an organic semiconductor layer 280 similar to the organic layer 180 of the bottom gate type organic light emitting display device 100, the organic semiconductor layer 280 is patterned using a LAT method. The organic semiconductor layer 280 is patterned so that the patterned organic semiconductor layer completely covers each of the first source electrode 211 and the first drain electrode 212. Although not illustrated in FIG. 7, the organic semiconductor layer 280 is patterned so as to completely cover other electrode wiring layers formed on the buffer layer 292, such as a second source electrode, a second drain electrode, a data wiring layer, a driving wiring layer, and a second capacitor layer.

When the top gate type organic light emitting display device 200 is patterned using the LAT method, since some parts of the organic semiconductor layer 280 and electrodes under the organic semiconductor layer 280 can be damaged, parts of the organic semiconductor layer to be removed are parts of the organic semiconductor layer not covering an electrode wiring layer formed on the buffer layer 292.

Next, a gate insulating layer 293 is further formed so as to cover the organic semiconductor layer 280, and a first gate electrode 213 and a pixel electrode 260 are formed on the gate insulating layer 293. Although not illustrated in FIG. 7, a second gated electrode, a scan wiring layer, and a first capacitor layer are also formed on the gate insulating layer 293.

After forming the first gate electrode 213, the pixel electrode 260, etc. on the gate insulating layer 293, a pixel definition layer 295, through which an opening 295a is formed, is formed on the gate insulating layer 293. An additional contact hole 293a is formed in the gate insulating layer 293 and the organic semiconductor layer 280 to electrically connect the pixel electrode 260 and the first drain electrode 212.

An organic light emitting layer 296 and an opposite electrode 297 are stacked on the exposed pixel electrode 260 sequentially. After forming the top gate type organic light emitting display device 200, an upper part of the organic light emitting display device 200 is sealed to provide protection from the atmosphere.

The structures of the first source electrode 211, the first drain electrode 212, the first gate electrode 213, the pixel electrode 260, the organic semiconductor layer 280, the substrate 291, the buffer layer 292, the gate insulating layer 293, the pixel definition layer 295, the organic light emitting layer 296, and the opposite electrode 297 illustrated in FIG. 7 are equivalent to the first source electrode 111, the first drain electrode 112, the first gate electrode 113, the pixel electrode 160, the organic semiconductor layer 180, the substrate 191, the buffer layer 192, the gate insulating layer 193, the pixel definition layer 195, the organic light emitting layer 1296, and the opposite electrode 197 of the organic light emitting display device 100 respectively, and thus detailed descriptions thereof has been omitted.

According to the current embodiment of the present invention, by patterning the organic semiconductor layer 280 so as to completely cover all the electrode wiring layers formed on the buffer layer 292, that is the first source electrode 211, the first drain electrode 212, the second source electrode, the second drain electrode, the data wiring layer, the driving wiring layer, and the second capacitor, the electrode wiring layers are not damaged during patterning of the organic semiconductor layer 280.

As the structure, operation, and effect of the organic light emitting display device 200 other than described herein are the same as the structure, operation, and effect of the organic light emitting display device 100 illustrated in FIGS. 1 through 6, a detailed descriptions thereof has been omitted.

Although the present invention is applied to an organic light emitting display device, the present invention can also be applied to various kinds of flat display devices such as liquid crystal display devices, etc. in which an organic semiconductor layer can be used. As described above, by applying a patterned organic semiconductor layer for protecting electrode wiring layers formed before the organic semiconductor layer is patterned, the electrode wiring layers can be protected, and the quality of product can be improved.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. An organic thin film transistor (OTFT), comprising:
a gate electrode;
a source electrode and a drain electrode insulated from the gate electrode;
an organic semiconductor layer insulated from the gate electrode and in contact with the source and drain electrodes, wherein the organic semiconductor layer covers each of the source and drain electrodes; and
a wiring layer connected to the source and drain electrodes, wherein the organic semiconductor layer completely covers the wiring layer.

2. The OTFT of claim 1, wherein the source and drain electrodes are insulated from the gate electrode by a gate insulating layer.

3. The OTFT of claim 1, wherein the organic semiconductor layer comprises a material selected from the group consisting of pentacene, tetracene, anthracene, naphthalene, α-6-thiophen, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylene vinylene and a derivative thereof, polyfluorene and a derivative thereof, polythiophene vynylene and a derivative thereof, polyparaphenylene and a derivative thereof, a polythiophene-heterocyclic aromatic copolymer and a derivative thereof, oligoacence of naphthalene and a derivative thereof, oligothiophene of α-5-thiophene and a derivative thereof, a metal-containing or metal-free phthalocyanine and a derivative thereof, pyromellitic dianhydride and a derivative thereof, pyromellitic diimide and a derivative thereof, perylene tetracarboxylic acid dianhydride and a derivative thereof, naphthalene tetracarboxylic acid diimide and a derivative thereof, naphthalene tetracarboxylic acid dianhydride and a derivative thereof.

4. The OTFT of claim 1, wherein the organic semiconductor layer completely covers each of the source electrode and the drain electrode.

5. An organic light emitting display device, comprising:
a substrate;
an electrical conductor arranged on the substrate;
an organic semiconductor layer covering the electrical conductor;
an organic light-emitting element electrically connected to the electrical conductor;
an organic thin film transistor (OTFT) that includes a gate electrode, and source and drain electrodes insulated from the gate electrode; and
a wiring layer connected to the source and drain electrodes, wherein the organic semiconductor layer completely covers the wiring layer.

6. The organic light emitting display device of claim 5, further comprising a pixel circuit electrically connected to the organic light-emitting element,
wherein the electrical conductor is at least one electrode wiring of the pixel circuit.

7. The organic light emitting display device of claim 5, wherein the organic semiconductor layer comprises a material selected from the group consisting of pentacene, tetracene, anthracene, naphthalene, α-6-thiophen, perylene and a derivative thereof, rubrene and a derivative thereof, coronene and a derivative thereof, perylene tetracarboxylic diimide and a derivative thereof, perylene tetracarboxylic dianhydride and a derivative thereof, polythiophene and a derivative thereof, polyparaphenylene vinylene and a derivative thereof, polyfluorene and a derivative thereof, polythiophene vynylene and a derivative thereof, polyparaphenylene and a derivative thereof, a polythiophene-heterocyclic aromatic copolymer and a derivative thereof, oligoacence of naphthalene and a derivative thereof, oligothiophene of α-5-thiophene and a derivative thereof, a metal-containing or metal-free phthalocyanine and a derivative thereof, pyromellitic dianhydride and a derivative thereof, pyromellitic diimide and a derivative thereof, perylene tetracarboxylic acid dianhydride and a derivative thereof, naphthalene tetracarboxylic acid diimide and a derivative thereof, naphthalene tetracarboxylic acid dianhydride and a derivative thereof.

8. The organic light emitting display device of claim 5, wherein the organic semiconductor layer completely covers the electrical conductor.

9. The organic light emitting display device of claim 5, wherein the electrical conductor includes the drain electrode.

* * * * *